(12) United States Patent
Matsuki (10) Patent No.: US 12,241,155 B2
(45) Date of Patent: Mar. 4, 2025

(54) METHOD FOR FORMING INSULATION FILM

(71) Applicant: Tokyo Electron Limited, Tokyo (JP)

(72) Inventor: Nobuo Matsuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 166 days.

(21) Appl. No.: 17/626,523

(22) PCT Filed: May 12, 2020

(86) PCT No.: PCT/JP2020/019010
§ 371 (c)(1),
(2) Date: Jan. 12, 2022

(87) PCT Pub. No.: WO2021/010004
PCT Pub. Date: Jan. 21, 2021

(65) Prior Publication Data
US 2022/0235456 A1 Jul. 28, 2022

(30) Foreign Application Priority Data
Jul. 18, 2019 (JP) ................. 2019-132694

(51) Int. Cl.
*C23C 16/32* (2006.01)
*C23C 16/458* (2006.01)

(52) U.S. Cl.
CPC ........ *C23C 16/325* (2013.01); *C23C 16/4581* (2013.01)

(58) Field of Classification Search
CPC ................... C23C 16/325; C23C 16/4581
See application file for complete search history.

(56) References Cited

U.S. PATENT DOCUMENTS

| 2004/0067308 | A1* | 4/2004 | Zheng | C23C 16/325 |
| | | | | 427/249.15 |
| 2011/0151677 | A1 | 6/2011 | Wang et al. | |
| 2012/0269989 | A1* | 10/2012 | Liang | C23C 16/345 |
| | | | | 427/579 |

FOREIGN PATENT DOCUMENTS

| JP | 2013-515355 A | 5/2013 |
| JP | 2014-512687 A | 5/2014 |
| KR | 10-2001-0111448 A | 12/2001 |
| KR | 10-2005-0083787 A | 8/2005 |
| KR | 10-2010-0116640 A | 11/2010 |
| KR | 10-2017-0024552 A | 3/2017 |

* cited by examiner

*Primary Examiner* — Kelly M Gambetta
(74) *Attorney, Agent, or Firm* — Armstrong Teasdale LLP (57) ABSTRACT

A method of forming an insulation film on a substrate, includes: reacting, as a film-forming gas, an oxygen-containing silicon compound gas represented by formula below with a non-oxidizing hydrogen-containing gas in a state in which at least the non-oxidizing hydrogen-containing gas is plasmarized, to form a film of a flowable silanol compound on the substrate; and subsequently, annealing the substrate to turn the flowable silanol compound into the insulation film. $Si_\alpha O_\beta(O-C_mH_n)_\Gamma C_xH_y$ (where m, n, and a are arbitrary integers of 1 or more, β, Γ, x, and y are arbitrary integers of 0 or more, and β and Γ are not 0 at a same time).

11 Claims, 6 Drawing Sheets

METHOD FOR FORMING INSULATION FILM

CROSS-REFERENCE TO RELATED APPLICATIONS

This application is a U.S. National Stage Application of International Patent Application No. PCT/JP2020/019010, having an International Filing Date of May 12, 2020, which claims the benefit of priority to Japanese Patent Application No. 2019-132694, filed Jul. 18, 2019, each of which is hereby incorporated by reference herein.

TECHNICAL FIELD

The present disclosure relates to a method for forming an insulation film.

BACKGROUND

In the process of manufacturing a semiconductor device, there is a step of embedding an insulation film containing silicon and oxygen in a fine three-dimensional structure on a substrate. In the related art, a coating technique has been used for embedding an insulation film containing silicon and oxygen, but, as a technique for obtaining a better film quality, there is provided flowable CVD in which a raw-material gas is introduced into a chamber, the molecular weight of the raw-material gas is increased inside the chamber, and the raw-material gas is made to have a liquid-like fluidity to form a film.

As an example of such a technique, Patent Document 1 discloses generating flowable polysilazane to form a polysilazane film on a substrate through radical CVD and then converting the polysilazane film into a silicon oxide through an oxidizing process such as exposing the polysilazane film to moisture.

PRIOR ART DOCUMENTS

Patent Documents

Patent Document 1: International Application Japanese Translation Publication No. 2014-512687

The present disclosure provides an insulation film forming method which is capable of forming a sufficiently oxidized high-density insulation film on a substrate through flowable CVD.

SUMMARY

A method of forming an insulation film according to an aspect of the present disclosure includes: reacting, as a film-forming gas, an oxygen-containing silicon compound gas represented by formula below with a non-oxidizing hydrogen-containing gas in a state in which at least the non-oxidizing hydrogen-containing gas is plasmarized, to form a film of a flowable silanol compound on the substrate; and subsequently, annealing the substrate to turn the flowable silanol compound into the insulation film, $Si_\alpha O_\beta (O-C_m H_n)_\Gamma C_x H_y$ (where m, n, and α are arbitrary integers of 1 or more, β, Γ, x, and y are arbitrary integers of 0 or more, and β and Γ are not 0 at a same time).

According to the present disclosure, there is provided an insulation film forming method which is capable of forming a sufficiently oxidized high-density insulation film on a substrate through flowable CVD.

DETAILED DESCRIPTION

Hereinafter, embodiments will be described in detail with reference to the accompanying drawings.

<History>

First, the history will be described.

In the case of using a coating technique when embedding an insulation film containing silicon and oxygen in a fine three-dimensional structure on a substrate, it is necessary to apply a coating material after making the coating material have fluidity and stability with a solvent or a stabilizer. When the coating material is turned into a film after the coating, the solvent and the like are released, and thus the film quality is deteriorated. Meanwhile, in flowable CVD, a flowable intermediate is generated inside the chamber to embed an insulation film in a fine three-dimensional structure. Thus, a film of better quality than that in the coating technique is obtained.

However, when the technique disclosed in Patent Document 1 is used as the flowable CVD, a flowable polysilazane oligomer is generated by plasma polymerization, a polysilazane film is deposited, and then when the oxidizing process is performed, the surface is first oxidized and solidified. Thus, the inner side of the polysilazane film may be inadequately oxidized. Meanwhile, it is conceivable to plasma-polymerize the silicon-containing material in an atmosphere containing $O_2$ or $H_2O$ to eliminate the need for post-oxidation. However, a large amount of moisture is required to prevent the condensation polymerization reaction from solidifying the silicon-containing material to hinder the fluidity of the silicon-containing material. Therefore, the moisture contained in the film is removed at the step of annealing and solidification, and the density reduction of the film occurs.

Results of a study for solving such a point were led to a method of forming an insulation film by reacting an oxygen-containing silicon compound gas having a specific structural formula with a non-oxidizing hydrogen-containing gas in a state in which at least the hydrogen-containing gas is plasmarized, and then annealing the substrate.

It was found that an aluminum-based insulation film and a titanium-based insulation film can also be similarly formed through film formation by flowable CVD and subsequent annealing.

First Embodiment

Figure 1:
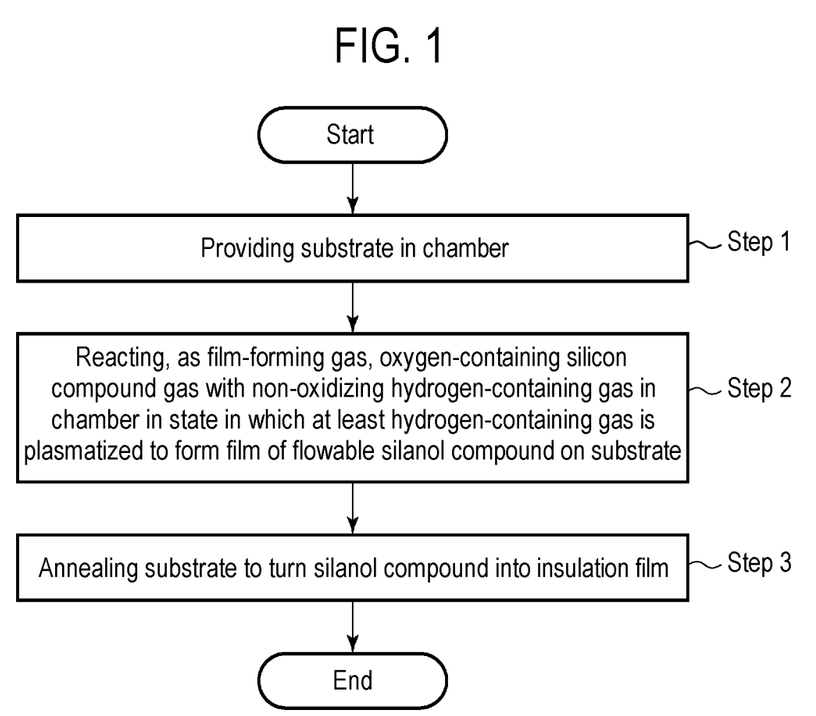
FIG. 1 is a flowchart illustrating an insulation film forming method according to a first embodiment.

Next, a first embodiment will be described.
[Insulation Film Forming Method]
FIG. 1 is a flowchart illustrating an insulation film forming method according to the first embodiment.

The present embodiment includes a step of providing a substrate inside a chamber (step 1), a step of reacting, as a film-forming gas, an oxygen-containing silicon compound gas with a non-oxidizing hydrogen-containing gas inside the chamber in a state in which at least the hydrogen-containing gas is plasmarized to form a film of a flowable silanol compound on the substrate (step 2), and then annealing the substrate to turn the silanol compound into an insulation film (step 3).

Figure 2:
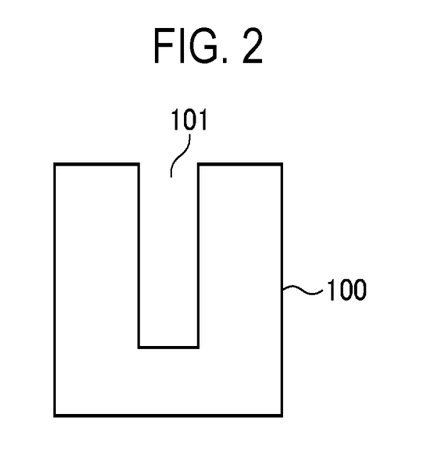
FIG. 2 is a cross-sectional view illustrating an example of a substrate whose surface has a fine three-dimensional structure.

In step 1, the substrate is not particularly limited, but a semiconductor substrate (a semiconductor wafer) such as silicon is exemplified. As the substrate, a substrate having a fine three-dimensional structure on the surface thereof may be used. The fine three-dimensional structure may be a structure in which a fine pattern is formed. The fine pattern has a gap. The gap may be, for example, a recess such as a trench or a hole. FIG. 2 illustrates an example of a substrate 100 having a structure in which a recess 101 such as a trench or a hole is formed. A base for forming the insulation film is not particularly limited.

The oxygen-containing silicon compound gas as the film-forming gas used in step 2 is represented by structural formula (1) below.

$$Si_\alpha O_\beta (O-C_m H_n)_\Gamma C_x H_y \quad (1)$$

where m, n, and α are arbitrary integers of 1 or more, β, Γ, x, and y are arbitrary integers of 0 or more, and β and Γ are not 0 at the same time.

Examples of such a compound include an alkoxysilane-based compound (alkoxysilane-based monomer) in the case in which β is 0 and Γ is 1 or more. Examples of the alkoxysilane-based compound include $(R1)_a Si(-O-R2)_{4-a}$ (where R1 may be any of $-CH_3$, $-C_2H_5$, $-C_3H_7$, $-C_2H_3$, and $-C_2H$, and R2 may be any of $-CH_3$ or $-C_2H_5$ where a is 0, 1, 2, or 3). Specifically, tetramethoxysilane (TMOS: $Si(OCH_3)_4$), methyltrimethoxysilane (MTMOS: $Si(OCH_3)_3CH_3$), tetraethoxysilane (TEOS: $Si(OC_2H_5)_4$), dimethyldimethoxysilane (DMDMOS: $Si(OCH_3)_2(CH_3)_2$), triethoxysilane ($SiH(OC_2H_5)_3$), trimethoxysilane ($SiH(OCH_3)_3$), trimethoxy-disiloxane ($Si(OCH_3)_3 OSi(OCH_3)_3$), and the like may be included. These compounds may be used alone or in combination of two or more.

As the film-forming gas, another gas may be added to the oxygen-containing silicon compound gas as described above. Examples of a first additive gas may include compounds having a $Si-C_m H_n$ bond, such as $Si-CH_3$, for example, methyltrimethoxysilane. Examples of a second additive gas may include an oxygen-free silicon compound represented by a structural formula $Si_s N_t C_u H_v$ (s and v are arbitrary integers of 1 or more, and t and u are arbitrary integers of 0 or more). The first additive gas is added to introduce $-C_m H_n$ groups (hydrocarbon groups) such as $-CH_3$ groups into the silanol compound formed after plasma processing. In addition, the second additive gas is added to reduce O (oxygen) of the silanol compound formed in step 2. The first additive gas and the second additive gas may be added either or both as necessary.

Examples of the non-oxidizing hydrogen-containing gas may include a $H_2$ gas, a $NH_3$ gas, and a $SiH_4$ gas, which may be used alone or in combination of two or more.

In step 2, in addition to the oxygen-containing silicon compound gas, the first additive gas, and/or the second additive gas added as needed, and the non-oxidizing hydrogen-containing gas, an inert gas, such as He, Ne, Ar, Kr, or $N_2$, may be supplied into the chamber.

In step 2, plasma is generated and flowable CVD is carried out, but the plasma generation method is not particularly limited, and various methods, such as capacitively coupled plasma, inductively coupled plasma, microwave plasma and the like, may be used. As for the plasma, at least the hydrogen-containing gas may be plasmarized. That is, both the film-forming gas and the hydrogen-containing gas may be plasmarized, or only the hydrogen-containing gas may be plasmarized. When only the hydrogen-containing gas is plasmarized, the hydrogen-containing gas may be plasmarized outside the chamber, introduced into the chamber as a remote plasma, and the film-forming gas may be supplied to the chamber as it is.

By such a reaction by plasma, a flowable silanol compound is formed on the substrate. The silanol compound refers to a silicon-containing monomer and an oligomer (multimer) having a Si—OH group.

That is, an oxygen-containing silicon compound, such as an alkoxysilane-based compound, is turned into a monomer of a silanol compound (for example, orthosilicic acid or methyltriol) by a reaction with plasma of a hydrogen-containing gas (hydrogen radical (H*)) since a hydrocarbon group, such as $-CH_3$ or $-O-CH_3$, or an alkoxy group is turned into, for example, $CH_4$ or $CH_4 OH$, and desorbed. Further, by the reaction with the plasma, a portion of the oxygen-containing silicon compound introduced as the film-forming gas is polymerized and turned into a polysilanol oligomer, and a hydrocarbon group or an alkoxy group is similarly desorbed from the polysilanol oligomer so that the polysilanol oligomer is turned into an oligomer of a silanol compound. The silanol compound thus produced on the substrate has fluidity in the monomer state and is embedded in a gap such as a recess. The silanol compound in the oligomer state also has fluidity and is embedded in a gap. Eventually, the gap (recess) is filled with the oligomer of the silanol compound.

Figure 3:
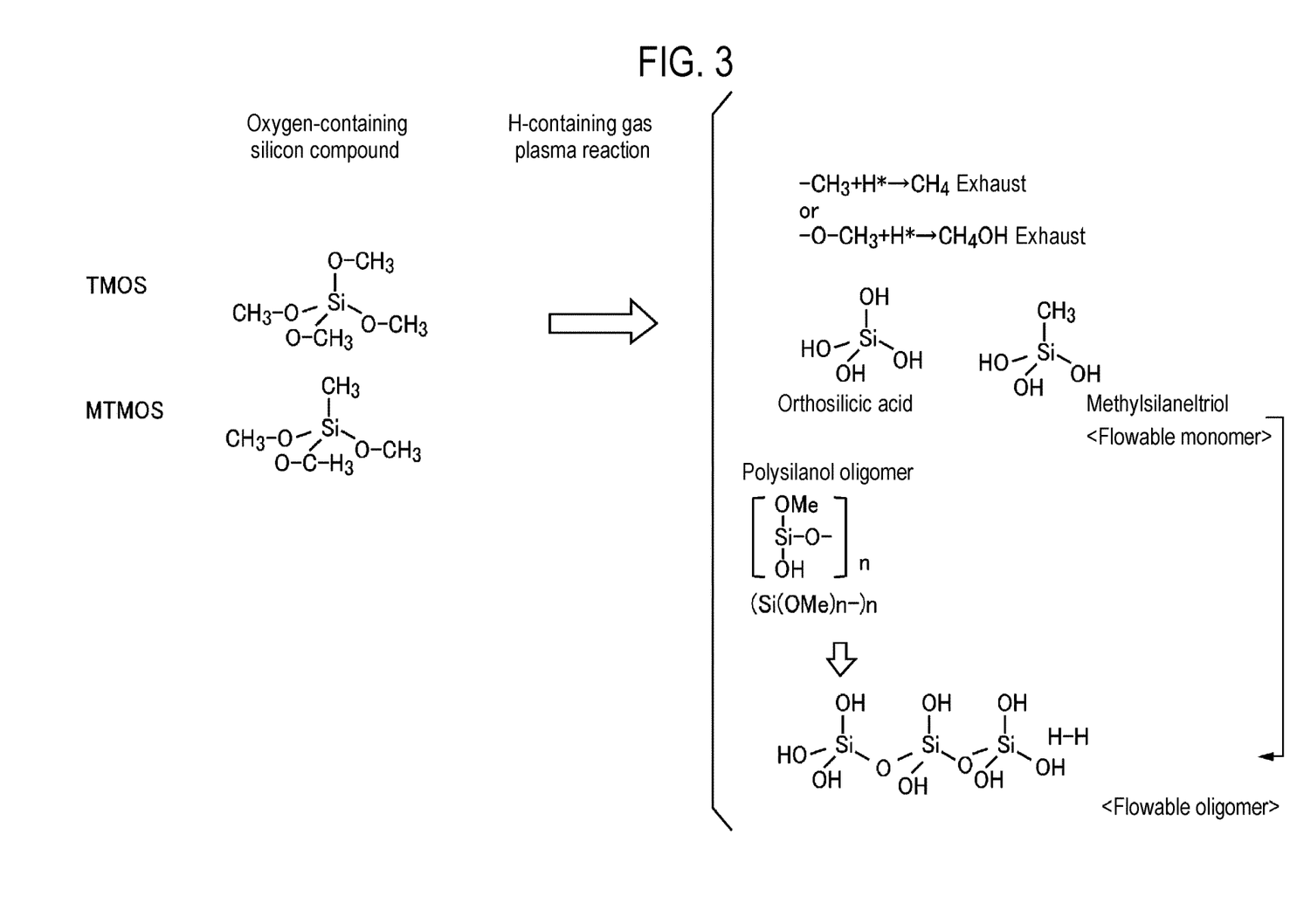
FIG. 3 is a view illustrating an example of a reaction when forming a silanol compound.

An example of the reaction at this time is illustrated in FIG. 3. Here, a case in which TMOS and MTMOS are used as the silicon compound constituting the film-forming gas is illustrated. TMOS is turned into orthosilicate by the reaction, and MTMOS is turned into methyltriol by the reaction.

Figure 4A:
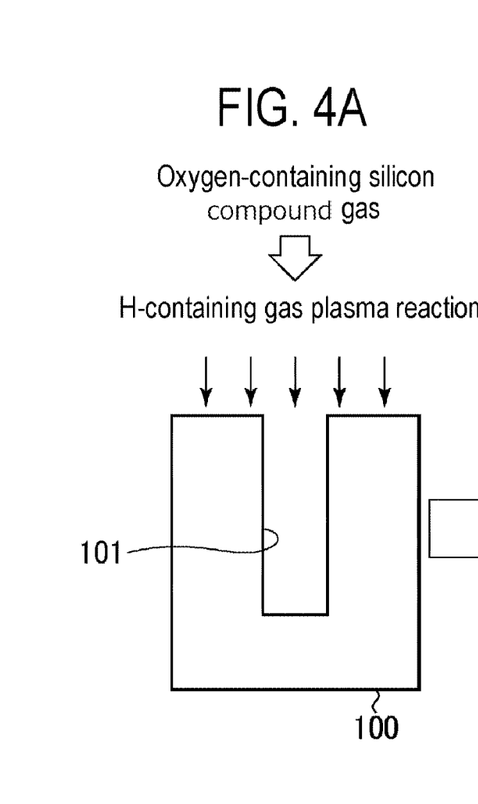
FIGS. 4A to 4D are views for explaining a flow of embedding through flowable CVD by a silanol compound.
Figure 4B:
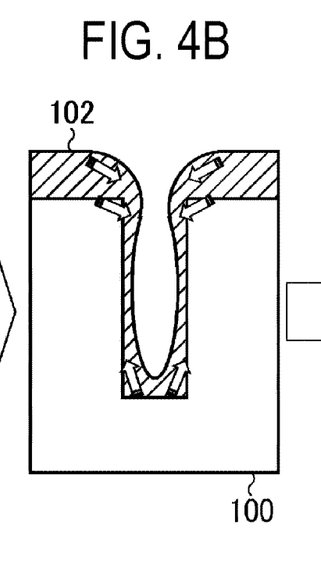
Figure 4C:
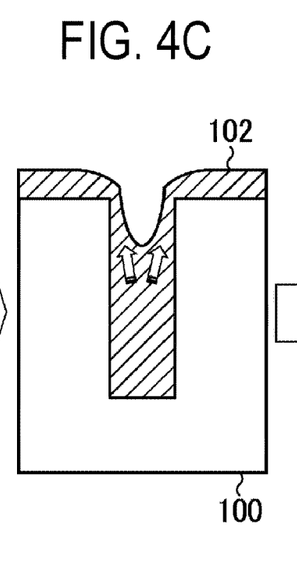
Figure 4D:
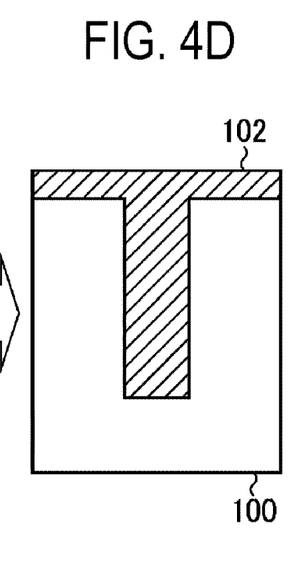

At this time, the embedding by flowable CVD with the silanol compound is performed, for example, as illustrated in FIGS. 4A to 4D. That is, when the oxygen-containing silicon compound gas reacts with the plasma of the hydrogen-containing gas as in FIG. 4A, a silanol compound 102 having fluidity in a liquid state as in FIG. 4B is generated, and the silanol compound 102 flows into the recess due to surface tension. At this time, the larger the molecular weight and the lower the temperature, the more likely the silanol compound is to become a liquid. Then, as in FIG. 4C, the silanol compound 102 is filled in the recess 101. Thereafter, a flattening process is carried out as in FIG. 4D to flatten the silanol compound.

Step 2 is preferably performed at a low temperature from the viewpoint of ensuring the fluidity of the silanol compound, preferably 250 degrees C. or lower. Above 250 degrees C., the fluidity of the silanol compound may be inadequate. The temperature is preferably −10 to 100 degrees C., more preferably −10 to 50 degrees C. The pressure in step 2 is preferably about 130 to 2,600 Pa.

Since the film formation by the flowable CVD in step 2 embeds a flowable silanol compound in the liquid state, good embedding property can be obtained without forming a cavity inside even in a gap (recess) having an aspect ratio of 10 or more.

Examples of the insulation film formed by performing the annealing in step 3 after forming the silanol compound may include a SiO film and a SiOCH film (or SiOC film), as will be described later. When forming a SiO film, the silanol compound film-formed in step 2 preferably has O/Si, as a ratio of O to Si, in the range of $1 \leq O/Si \leq 4$. When forming a SiOCH film (or SiOC film), the silanol compound film-formed in step 2 preferably has O/Si, as a ratio of O to Si, in the range of $0.5 \leq O/Si \leq 4$.

Figure 5:
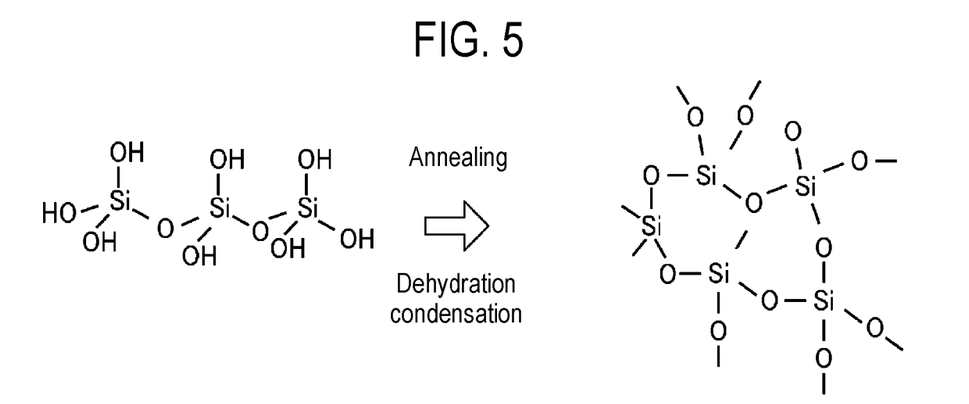
FIG. 5 is a view illustrating an example of a reaction when annealing a silanol compound.

The annealing in step 3 changes the silanol compound generated on the substrate and embedded in the gap (recess) into a silicon-based insulation film by heating the substrate after performing step 2. For example, as illustrated in FIG. 5, annealing causes a dehydration condensation reaction in the oligomer of the silanol compound to form a Si—O—Si bond, and a glassy SiO film having a network structure of Si and O is formed as an insulation film.

When a Si—$C_mH_n$ bond is present in the oxygen-containing silicon compound used as the film-forming gas, for example, when the oxygen-containing silicon compound is MTMOS, a portion of —$C_mH_n$ remains and the formed insulation film is turned into a SiOCH film containing C and H in the network of Si and O (or a SiOC film containing C in the network of Si and O). The SiOCH film (or the SiOC film) may be used as, for example, a low dielectric constant film (a low-k film). However, the film may also be used for applications other than the low-k film. By adding the first additive gas having a Si—$C_mH_n$ bond as described above to the oxygen-containing silicon compound gas, the concentration of the $C_mH_n$ groups in the insulation film may be made to a desired concentration.

By adding the second additive gas, which is an oxygen-free silicon compound as described above, to the oxygen-containing silicon compound gas to reduce the O of the silanol compound, it is possible to reduce the amount of $H_2O$ desorbed during annealing and thus to reduce the volume reduction during the annealing. In addition, by appropriately adjusting the amount of the second additive gas, the reaction during the annealing may be limited to a dehydrogenation reaction.

The annealing in step 3 is preferably performed in a chamber different from the chamber in which step 2 is performed. The annealing is preferably performed at a temperature higher than the temperature in step 2, preferably 80 degrees C. or higher, and preferably 850 degrees C. or lower. The atmosphere of annealing is not particularly limited, but it is preferably performed in a non-oxidizing atmosphere. When the SiOCH film is formed in an oxidizing atmosphere, C-containing groups may disappear in a portion close to the surface. Here, the non-oxidizing atmosphere refers to a gas atmosphere that does not oxidize the base, and may contain oxygen as long as it does not oxidize the base.

As the non-oxidizing atmosphere, for example, an inert gas atmosphere of, for example, Ar, He, or $N_2$, is preferable.

The preferred conditions for annealing in step 3 differ depending on a base. The preferred conditions for each substrate are as follows.

(1) When forming a film on a resist or SOC (spin on carbon) in a patterning step Annealing is performed in a non-oxidizing atmosphere at 90 to 350 degrees C.

(2) When forming a film on a base containing a structure formed of a material with low heat resistance such as metal or Ge.

(i) A first step at 100 to 250 degrees C. and a second step at 250 to 450 degrees C. are performed in combination (in both steps, annealing in a non-oxidizing atmosphere).

(ii) The first step at 100 to 250 degrees C. and the second step at 250 to 450 degrees C. are performed in combination, and at least one of the two steps is combined with ultraviolet (UV) irradiation (in both steps, annealing in a non-oxidizing atmosphere).

(3) When embedding shallow trench isolation (STI) that does not include a structure of materials with low heat resistance (i) A first step at 100 to 400 degrees C. and a second step at 650 to 850 degrees C. are performed in combination (in both steps, annealing in a non-oxidizing atmosphere).

(ii) The first step at 100 to 400 degrees C. and the second step at 650 to 850 degrees C. are performed in combination, and the first step is combined with ultraviolet (UV) irradiation (in both steps, annealing in a non-oxidizing atmosphere).

Annealing may be performed using a dedicated annealing apparatus, but when a heating process is included in the subsequent steps after the silanol compound is generated on the substrate in step 2, the annealing of the present embodiment may be performed by that step.

According to the present embodiment, the oxygen-containing silicon compound gas and the non-oxidizing hydrogen-containing gas are reacted with each other in a state in which at least the hydrogen-containing gas is plasmarized to generate a flowable silanol compound on the substrate. Since the generated silanol compound contains oxygen, an insulation film such as a SiO film or a SiOCH film (or a SiOC film) can be formed only by annealing. Therefore, a post-oxidizing process as in Patent Document 1 is not required. Therefore, unlike Patent Document 1, there is no possibility that oxidizing will be insufficient during the post-oxidizing process. In the technique of Patent Document 1, when trying to obtain a SiOCH film, there is a possibility that a desired film cannot be obtained due to damage such as the disappearance of C-containing groups in a portion close to the surface of the polymerized film during the post-oxidizing process. However, in the method of the present embodiment, a good SiOCH film can be obtained without such a case.

In the present embodiment, a silanol compound in a pure liquid state that does not contain unnecessary $H_2O$ in deposits can be deposited on the substrate through plasma processing of the non-oxidizing hydrogen-containing gas (e.g., $H_2$ plasma processing). Therefore, since the volume change of the film due to the removal of $H_2O$ is small, the density of the obtained insulation film can be maintained at a high level. In addition, since the silanol compound containing no water can be deposited, the stability of the reaction is obtained.

[Film Forming Apparatus]

Next, a film forming apparatus configured to perform film formation by flowable CVD in step 2 will be described.

Figure 6:
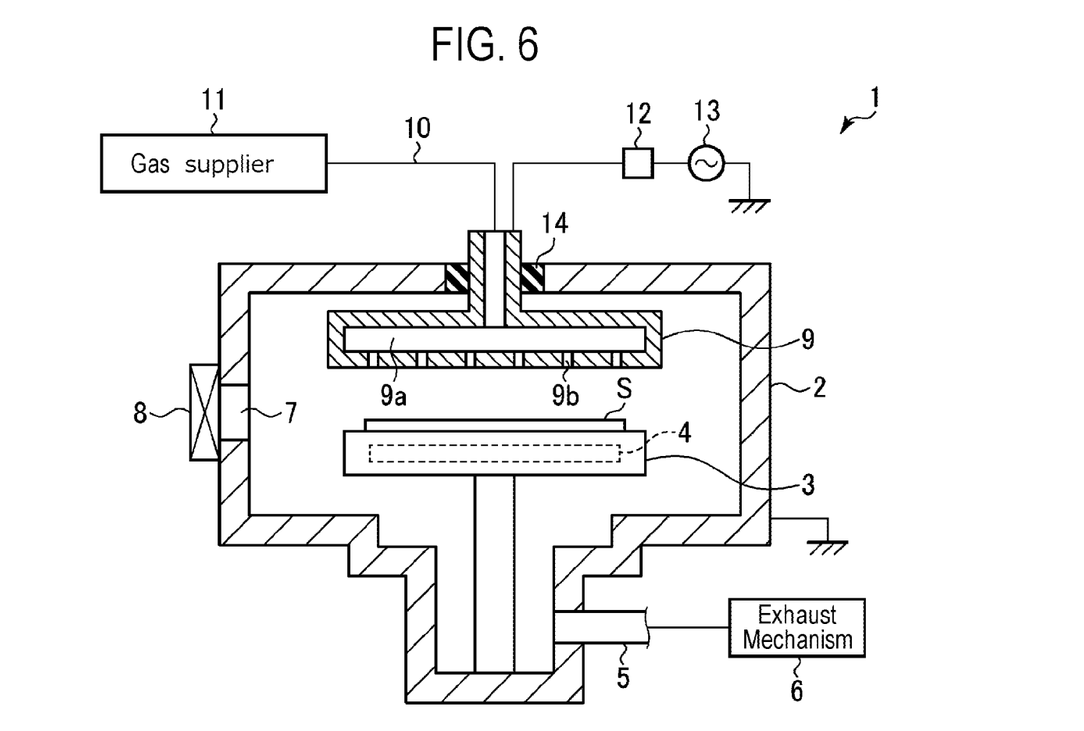
FIG. 6 is a cross-sectional view illustrating an example of a film forming apparatus that performs flowable CVD.

FIG. 6 is a cross-sectional view illustrating an example of the film forming apparatus. As illustrated in FIG. 6, the film forming apparatus 1 includes a chamber 2. The chamber 2 is grounded. A stage 3 configured to horizontally place thereon a substrate S is provided inside the chamber 2. The stage 3 is made of metal, and includes a temperature controller 4 provided therein to control the temperature of the substrate S. The stage 3 is grounded via the chamber 2.

An exhaust pipe 5 is connected to the bottom portion of the chamber 2. An exhaust device 6 having a function of controlling an internal pressure of the chamber 2 is connected to the exhaust pipe 5. A transfer port 7 for transferring the substrate S is formed in the sidewall of the chamber 2. The transfer port 7 is opened/closed by a gate valve 8.

A gas shower head 9 is provided in the upper portion of the chamber 2 to face the stage 3. The gas shower head 9 includes a gas chamber 9a defined therein and a plurality of gas ejection holes 9b formed in the bottom portion thereof. The gas shower head 9 and the ceiling wall of the chamber 2 are insulated from each other by an insulation member 14.

A gas supplier 11 is connected to the gas shower head 9 via a gas flow path 10. The gas supplier 11 supplies an oxygen-containing silicon compound gas, which is a film-forming gas, and a non-oxidizing hydrogen-containing gas. As the film forming gas, at least one of the above-mentioned first additive gas and second additive gas may be added. In addition, an inert gas may be supplied as a carrier gas, a diluting gas, a plasma generating gas, or the like. These gases reach the gas chamber 9a of the gas shower head 9 from the gas supplier 11 via the gas flow path 10, and are ejected into the chamber 2 through the gas ejection holes 9b.

A radio-frequency power supply 13 is connected to the gas shower head 9 via a matcher 12. The radio-frequency power supply 13 applies radio-frequency power of, for example, 13.56 MHz, to the gas shower head 9. When the radio-frequency power is applied to the gas shower head 9, a radio-frequency electric field is formed between the gas shower head 9 and the stage 3, and capacitively coupled plasma is generated by the gas ejected from the gas shower head 9.

In the film forming apparatus 1, the substrate S is placed on the stage 3, the temperature of the substrate S is controlled to 250 degrees C. or lower, for example, −10 to 100 degrees C. by the temperature controller 4, and the internal pressure is controlled to 130 to 2,600 Pa. The oxygen-containing silicon compound gas and the non-oxidizing hydrogen-containing gas are supplied from the gas supplier 11 into the chamber 2 via the gas shower head 9, and radio-frequency power is supplied from the radio-frequency power supply 13 to the gas shower head. As a result, plasmas of the oxygen-containing silicon compound gas and the hydrogen-containing gas are generated, and a film of a flowable silanol compound is formed on the substrate S by these reactions, and the silanol compound is embedded in the gap (recess) formed in the substrate S.

The annealing apparatus for performing the annealing process including, for example, a chamber, a stage provided inside the chamber, a heating mechanism configured to heat the substrate, a gas supply mechanism configured to supply gas to the chamber, and an exhaust mechanism configured to evacuate the interior of the chamber is exemplified.

EXPERIMENTAL EXAMPLE

Next, experimental examples will be described.

Experimental Example 1

Here, film formation of a silanol compound was performed on a substrate having a trench structure with an aspect ratio of 6.5 by flowable CVD using the film forming apparatus having the structure illustrated in FIG. 6, using TEOS as the oxygen-containing silicon compound, using $H_2$ as the hydrogen-containing gas, and using Ar gas as the inert gas. The film thickness was 212.8 nm.

Figure 7:
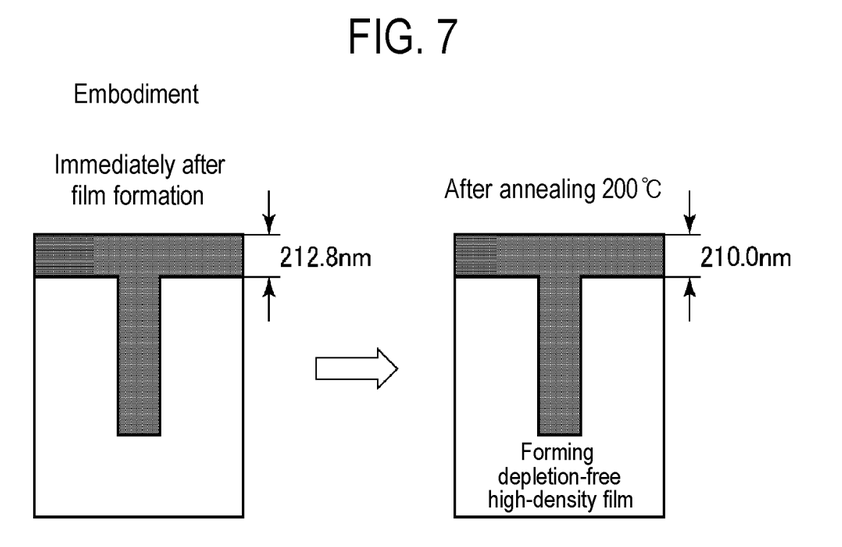
FIG. 7 is a schematic view illustrating a state when a film of a silanol compound is formed on a substrate having a trench structure according to the first embodiment and a state after annealing in Experimental example 1.

The conditions at this time were as follows.
Temperature of Stage: 30 degrees C.
Pressure: 4 Torr (533 Pa)
Flow rate of TEOS gas: 30 sccm
Flow rate of $H_2$ gas: 50 sccm
Flow rate of Ar gas: 50 sccm
Radio-frequency power supply
    Frequency: 13.56 MHz
    Power: 300 W
Processing time: 100 sec The film formed in this way was annealed at 200 degrees C. in an Ar atmosphere. As a result, the film thickness reduced to 210.0 nm, and the film thickness reduction rate was 1.3%. As a result of the small reduction in film thickness due to the annealing, a depletion-free high-density film was formed in a narrow trench structure. The states immediately after film formation and after annealing are schematically illustrated in FIG. 7.

For comparison, film formation was performed on a substrate having a trench structure with an aspect ratio of 6.5 by flowable CVD in exactly the same manner except that the $H_2$ gas was changed to $O_2$ gas (50 sccm). The film thickness was 190.1 nm.

Figure 8:
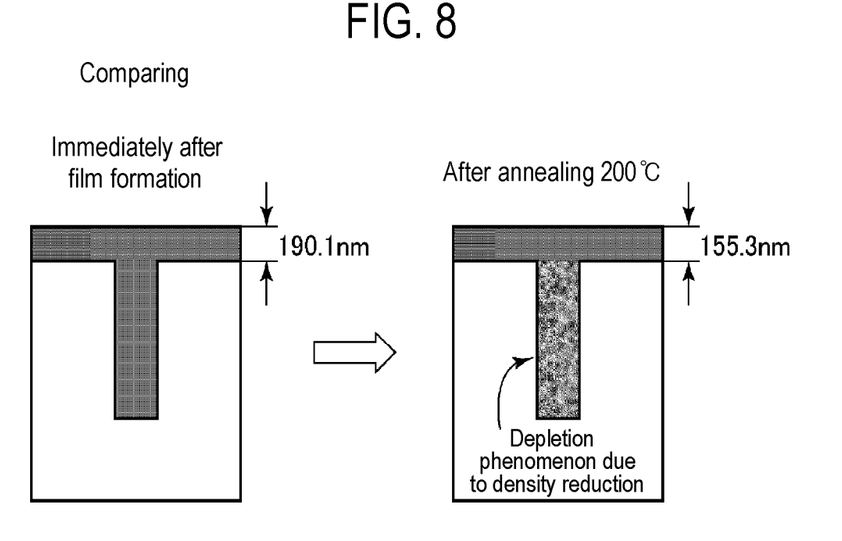
FIG. 8 is a schematic view illustrating a state when a film of a silanol compound is formed on a substrate having a trench structure using an $O_2$ gas instead of a $H_2$ gas for comparison and a state after annealing in Experimental example 1.

The film formed in this way was annealed at 200 degrees C. in an Ar atmosphere. As a result, the film thickness was reduced to 155.3 nm, and the film thickness reduction rate was 18%. As a result of the large reduction in film thickness due to annealing in this way, a film having a porous structure with a low density was formed due to film shrinkage in the narrow trench structure. The states immediately after film formation and after annealing are schematically illustrated in FIG. 8.

Experimental Example 2

Next, film formation was formed by flowable CVD by changing the gas for generating plasma, and the shrinkage of the film after being left at room temperature for 2 hours was confirmed.

Here, film formation was performed by flowable CVD using MTMOS as the oxygen-containing silicon compound, and using four types of gases such as $H_2$ gas (Case 1), $O_2$ gas (Case 2), $H_2O$ gas (Case 3), $H_2O$ gas+$NH_3$ (Case 4) as gases when generating plasma. In Case 1, the flow rate of the $H_2$ gas was 50 sccm, in Case 2, the flow rate of the $O_2$ gas was 5 sccm, in Case 3, the flow rate of the $H_2O$ gas was 20 sccm, and in Case 4, the flow rates of the $H_2O$ gas and the $NH_3$ gas were 20 sccm and 5 sccm, respectively. Other conditions were the same as those in Experimental Example 1 except that the radio-frequency power was 50 W.

Table 1 shows, for each case, the film thickness immediately after film formation, the film thickness after being left at room temperature for 2 hours, and the shrinkage rate. As shown in Table 1, Case 1 using the $H_2$ gas, which is the non-oxidizing hydrogen-containing gas according to the present embodiment, had an extremely small shrinkage rate of 1.2%. In contrast, in Cases 2 to 4 in which plasma processing was performed using an oxygen-containing gas, the shrinkage rate was as large as 11 to 40%. It is considered that this is because in Cases 2 to 4, water was generated during the film formation, and the water was released after being left at room temperature. In Case 1, it is considered that since almost no water is generated, the film shrinkage is very small, and the film becomes a high-density film even after annealing.

TABLE 1

|  | Film thickness immediately after film formation [nm] | Film thickness after being left at room temperature [nm] | Shrinkage rate [%] |
| --- | --- | --- | --- |
| Case 1 ($H_2$) | 232.8 | 230.0 | 1.2 |
| Case 2 ($O_2$) | 193.1 | 155.3 | 19.6 |
| Case 3 ($H_2O$) | 211.3 | 188.1 | 11.0 |
| Case 4 ($H_2O + NH_3$) | 191.4 | 114.8 | 40.0 |

Second Embodiment

Next, a second embodiment will be described.

In the present embodiment, an aluminum-based insulation film is formed as the insulation film.

Figure 9:
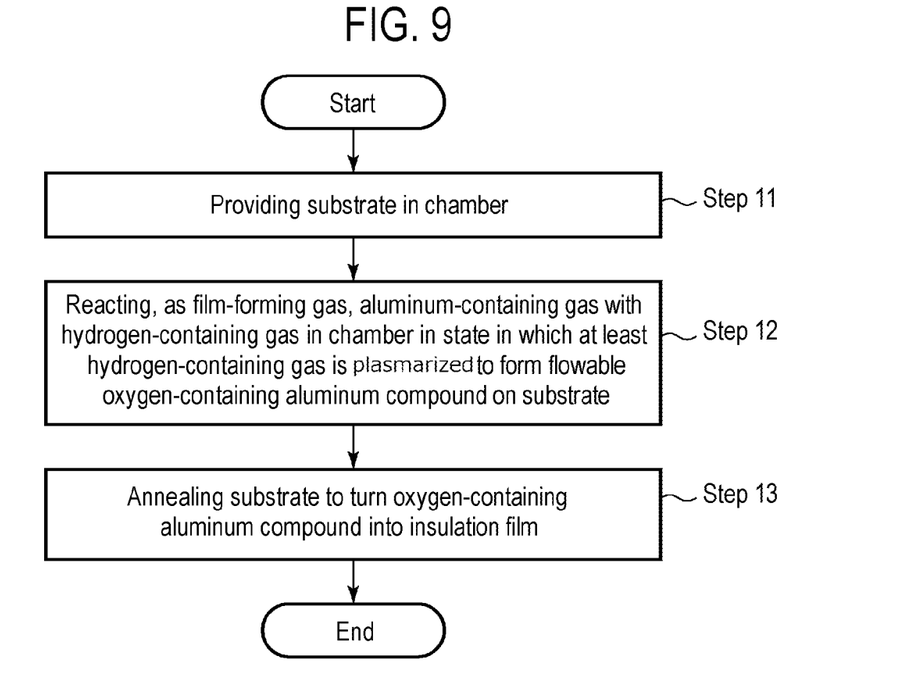
FIG. 9 is a flowchart illustrating an insulation film forming method according to a second embodiment.

FIG. 9 is a flowchart illustrating an insulation film forming method according to the second embodiment.

The present embodiment includes a step of providing a substrate inside a chamber (step 11), a step of reacting, as a film-forming gas, an aluminum-containing gas with a hydrogen-containing gas inside the chamber in a state in which at least the hydrogen-containing gas is plasmarized to form a film of a flowable oxygen-containing aluminum compound on the substrate (step 12), and then annealing the substrate to turn the oxygen-containing aluminum compound into an insulation film (step 13).

In step 11, the same substrate as that in step 1 of the first embodiment may be used.

In step 12, as the aluminum-containing gas used as the film-forming gas, an aluminum compound represented by structural formula (2) below may be used.

$$Al_\alpha O_\beta (O-C_m H_n)_\Gamma C_x H_y \qquad (2)$$

where m, n, and α are arbitrary integers of 1 or more, and β, Γ, x, and y are arbitrary integers of 0 or more.

Examples of such a compound may include an aluminum alkoxide-based compound in the case in which β is 0 and Γ is 1 or more, for example, aluminum trimethoxyd ($Al(OH_3)_3$) and aluminum isopropoxide ($Al(O-i-Pr)_3$), and trimethylaluminum (TMA: $Al(CH_3)_3$) in the case in which B and Γ are 0. These compounds may be used alone or in combination of two or more.

In addition, as the aluminum-containing gas as the film-forming gas, $AlCl_3NH_3$, $(NH_4)_3AlF_6$, $Al(i-Bu)_3$ (where Bu is a butyl group) may be used.

When the aluminum-containing gas used as the film-forming gas contains oxygen, an oxygen-free aluminum compound may be added as an additive gas. Examples of such an additive gas may include TMA, $AlCl_3NH_3$, $(NH_4)_3AlF_6$, and $Al(i-Bu)_3$. Such an additive gas is added to reduce O (oxygen) of the aluminum compound formed by step 12.

As the hydrogen-containing gas, when O is contained in the aluminum-containing gas used as the film-forming gas, a $H_2$ gas, a $NH_3$ gas, and a $SiH_4$ gas may be included as in the first embodiment, and these gases may be used alone or in combination of two or more. When the aluminum-containing gas does not contain O, a hydrogen-containing gas containing O is used. For example, a gas obtained by adding one or more of oxygen-containing gases, such as $O_2$ gas, NO, $N_2O$, $CO_2$, and $H_2O$, to one or more of the $H_2$ gas, the $NH_3$ gas, and the $SiH_4$ gas is used.

In step 12, in addition to the aluminum-containing gas, the additive gas added as needed, and the hydrogen-containing gas, an inert gas, such as He, Ne, Ar, Kr, or $N_2$, may be supplied into the chamber.

In step 12, plasma is generated and flowable CVD is carried out, but the plasma generation method is not particularly limited, as in the first embodiment, and various methods, such as capacitively coupled plasma, inductively coupled plasma, and microwave plasma, may be used. As for plasma, at least the hydrogen-containing gas may be plasmarized, and both the film-forming gas and the hydrogen-containing gas may be plasmarized, or only the hydrogen-containing gas may be plasmarized.

By such a reaction by plasma, a film of a flowable oxygen-containing aluminum compound is formed on the substrate. The oxygen-containing aluminum compound is, for example, an aluminum-containing monomer and an oligomer (multimer) having an Al—OH group.

At this time, the aluminum-containing gas reacts with the plasma of the hydrogen-containing gas to be turned into a flowable oxygen-containing aluminum compound. The formed oxygen-containing aluminum compound has fluidity in a monomer state and is embedded in a gap such as a recess. In addition, due to the reaction by plasma, the aluminum compound is turned into an aluminum compound in an oligomer state having fluidity and is embedded in the gap. Eventually, the gap (recess) is filled with the oligomer of the oxygen-containing aluminum compound.

At this time, embedding by flowable CVD with the oxygen-containing aluminum compound is performed, for example, as illustrated in FIGS. 4A to 4D, as in the first embodiment.

Step 12 is preferably performed at a low temperature from the viewpoint of ensuring the fluidity of the formed oxygen-containing aluminum compound, preferably at 250 degrees C. or lower. The temperature is preferably −10 to 100 degrees C., even more preferably −10 to 50 degrees C. The pressure in step 12 is preferably about 130 to 2,600 Pa.

Since the film formation by the flowable CVD in step 12 embeds a flowable aluminum compound in a liquid state, good embedding property can be obtained without forming a cavity inside even in a gap (recess) having an aspect ratio of 10 or more.

The annealing in step 13 changes the oxygen-containing aluminum compound generated on the substrate and embedded in the gap (recess) into an aluminum-based insulation film by heating the substrate after performing step 12. For example, the annealing causes a dehydration condensation reaction in the oligomer of the aluminum compound to form an AlO film.

By adding an oxygen-free aluminum compound as an additive gas as described above to reduce O of the oxygen-containing aluminum compound formed as a film, the amount of $H_2O$ desorbed during the annealing is reduced so that the volume reduction during the annealing can be reduced. In addition, by appropriately adjusting the amount of the additive gas, the reaction during the annealing may be limited to a dehydrogenation reaction.

The annealing in step 13 is preferably performed in a chamber different from the chamber in which step 12 is performed, as in step 3 of the first embodiment. The temperature is higher than the temperature in step 12, and preferably 80 degrees C. or higher, more preferably 850 degrees C. or lower.

In the present embodiment, the aluminum-containing gas and the hydrogen-containing gas are reacted with each other in a state in which at least the hydrogen-containing gas is plasmarized to generate a flowable oxygen-containing aluminum compound on the substrate. Since the generated aluminum compound contains oxygen, an AlO film can be formed only by annealing, and no post-oxidizing process is required. In addition, the intervention of $H_2O$ can be reduced as much as possible, the volume change of the film due to the removal of $H_2O$ can be reduced, and the density of the obtained insulation film can be maintained at a high level.

As the film forming apparatus for performing flowable CVD used in step 12, the apparatus illustrated in FIG. 6 described in the first embodiment may be used.

Third Embodiment

Next, a third embodiment will be described.

In the present embodiment, a titanium-based insulation film is formed as the insulation film.

Figure 10:
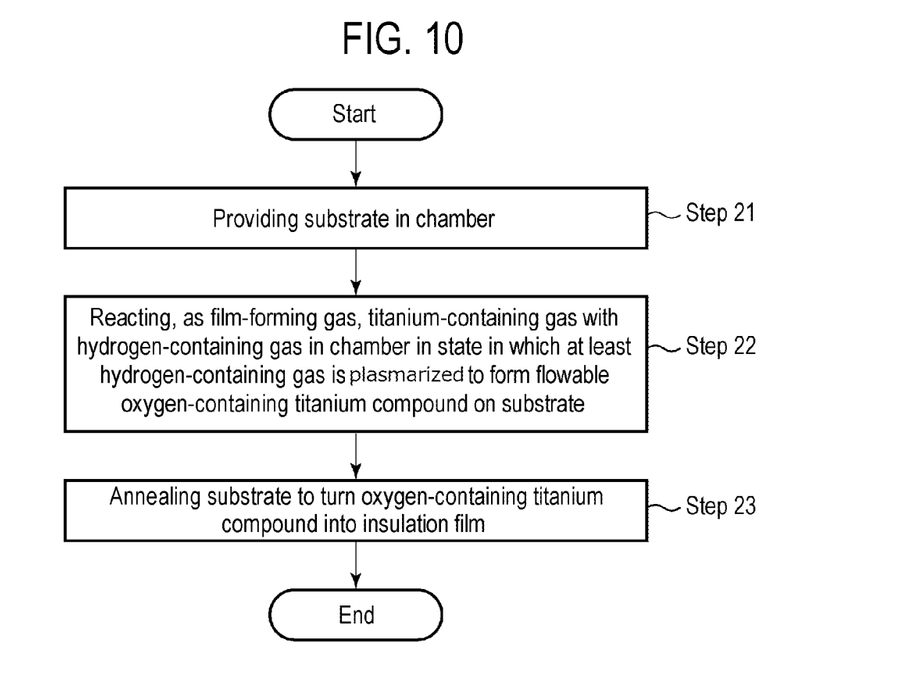
FIG. 10 is a flowchart illustrating an insulation film forming method according to a third embodiment.

FIG. 10 is a flowchart illustrating an insulation film forming method according to a third embodiment.

The present embodiment includes a step of providing a substrate inside a chamber (step 21), a step of reacting, as a film-forming gas, a titanium-containing gas with a hydrogen-containing gas inside the chamber in a state in which at least the hydrogen-containing gas is plasmarized to form a film of a flowable oxygen-containing titanium compound on the substrate (step 22), and then annealing the substrate to turn the oxygen-containing titanium compound into an insulation film (step 23).

In step 21, the same substrate as that in step 1 of the first embodiment may be used.

In step 22, as the titanium-containing gas used as the film-forming gas, a titanium compound represented by structural formula (3) below may be used.

$$\text{Ti}(O-C_mH_n)_\alpha C_xH_y \qquad (3)$$

where m and n are arbitrary integers of 1 or more, and α, x, and y are arbitrary integers of 0 or more.

Examples of such a compound may include a titanium alkoxide-based compound such as tetraisopropyl titanate $(Ti(OCH(CH_3)_2)_4)$, $Ti(MeCp)(OMe)_3$, and $Ti(Me_5Cp)(OMe)_3$ (where Me is a methyl group and Cp is a cyclopentadienyl group).

In addition, as the titanium-containing gas as a film-forming gas, tetrakisdimethylaminotitanium (TDMAT: $Ti(N(CH_3)_2)_4$), $TiCp(NMe_2)_3$, $TiMe_5Cp(NMe_2)_3$, or titanium tetrachloride ($TiCl_4$) may be used.

When the titanium-containing gas used as the film-forming gas contains oxygen, an oxygen-free titanium compound may be added as an additive gas. Examples of such an additive gas may include TDMAT, $TiCp(NMe_2)_3$, $TiMe_5Cp(NMe_2)_3$, and $TiCl_4$. Such an additive gas is added to reduce O of the titanium compound formed by step 22.

As the hydrogen-containing gas, when O is contained in the titanium-containing gas, a $H_2$ gas, a $NH_3$ gas, and a $SiH_4$ gas may be included as in the first embodiment, and these gases may be used alone or in combination of two or more.

When the titanium-containing gas does not contain O, a hydrogen-containing gas containing O is used. For example, a gas obtained by adding at least one of oxygen-containing gases, such as $O_2$ gas, NO, $N_2O$, $CO_2$, and $H_2O$, to at least one of the $H_2$ gas, the $NH_3$ gas, and the $SiH_4$ gas is used.

In step 22, in addition to the film forming gas including the titanium-containing gas and the hydrogen-containing gas, an inert gas, such as He, Ne, Ar, Kr, or $N_2$, may be supplied into the chamber.

In step 22, plasma is generated and flowable CVD is carried out, but the plasma generation method is not particularly limited, as in the first embodiment, and various methods, such as capacitively coupled plasma, inductively coupled plasma, and microwave plasma, may be used. As for plasma, at least the hydrogen-containing gas may be plasmarized, and both the film-forming gas and the hydrogen-containing gas may be plasmarized, or only the hydrogen-containing gas may be plasmarized.

By such a reaction by plasma, a film of a flowable oxygen-containing titanium compound is formed on the substrate. The oxygen-containing titanium compound is, for example, a titanium-containing monomer and an oligomer (multimer) having a Ti—OH group.

At this time, the titanium-containing gas reacts with the plasma of the hydrogen-containing gas to be turned into a flowable oxygen-containing titanium compound. The formed oxygen-containing titanium compound has fluidity in a monomer state and is embedded in a gap such as a recess. In addition, due to the reaction by plasma, the titanium compound is turned into a titanium compound in an oligomer state having fluidity and is embedded in the gap. Eventually, the gap (recess) is filled with the oligomer of the oxygen-containing titanium compound.

At this time, embedding by flowable CVD with the oxygen-containing titanium compound is performed, for example, as illustrated in FIGS. 4A to 4D, as in the first embodiment.

Step 22 is preferably performed at a low temperature from the viewpoint of ensuring the fluidity of the formed oxygen-containing titanium compound, preferably at 250 degrees C. or lower. The temperature is preferably −10 to 100 degrees C., even more preferably −10 to 50 degrees C. The pressure in step 22 is preferably about 130 to 2,600 Pa.

Since the film formation by the flowable CVD in step 22 embeds a flowable titanium compound in a liquid state, good embedding property can be obtained without forming a cavity inside even in a gap (recess) having an aspect ratio of 10 or more.

The annealing in step 23 changes the oxygen-containing titanium compound generated on the substrate and embedded in the gap (recess) into a titanium-based insulation film by heating the substrate after performing step 22. For example, the annealing causes a dehydration condensation reaction in the oligomer of the titanium compound to form a TiO film.

By adding an oxygen-free titanium compound as an additive gas as described above to reduce O of the oxygen-containing titanium compound formed as a film, the amount of $H_2O$ desorbed during the annealing is reduced so that the volume reduction during the annealing can be reduced. In addition, by appropriately adjusting the amount of the additive gas, the reaction during the annealing may be limited to a dehydrogenation reaction.

The annealing in step 23 is preferably performed in a chamber different from the chamber in which step 22 is performed, as in step 3 of the first embodiment. The temperature is higher than the temperature of step 22 and preferably 80 degrees C. or higher, and preferably 850 degrees C. or lower. The atmosphere of annealing is not particularly limited, and may be a non-oxidizing atmosphere or an oxidizing atmosphere.

In the present embodiment, the titanium-containing gas and the hydrogen-containing gas are reacted with each other in a state in which at least the hydrogen-containing gas is plasmarized to generate a flowable oxygen-containing titanium compound on the substrate. Since the generated titanium compound contains oxygen, a TiO film can be formed only by annealing, and no post-oxidizing process is required. In addition, the intervention of $H_2O$ can be reduced as much as possible, the volume change of the film due to the removal of $H_2O$ can be reduced, and the density of the obtained insulation film can be maintained at a high level.

As the film forming apparatus for performing flowable CVD used in step 22, the apparatus illustrated in FIG. 6 described in the first embodiment may be used.

<Other Applications>

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, the film-forming gases specifically described in the above embodiments are merely examples, and other gases satisfying the conditions may be used. In addition, the film forming apparatus is merely an example, and a film forming apparatus having various structures capable of performing plasma processing may be applicable. As the substrate, a semiconductor substrate (a semiconductor wafer) such as silicon has been exemplified, but the present disclosure is not limited thereto, and various other substrates may be used.

EXPLANATION OF REFERENCE NUMERALS

1: film forming apparatus, 100: substrate, 101: recess, 102: silanol compound

What is claimed is:

1. A method of forming an insulation film on a substrate, the method comprising:
   forming a film of a flowable silanol compound that does not contain $H_2O$ on the substrate by reacting, as a film-forming gas, an oxygen-containing silicon compound gas represented by formula (1) below with a non-oxidizing hydrogen-containing gas in a state in which at least the non-oxidizing hydrogen-containing gas is plasmarized; and
   subsequently, annealing the substrate to turn the flowable silanol compound into the insulation film, $$Si_\alpha O_\beta (O-C_m H_n)_\Gamma C_x H_y \qquad (1)$$

where m, n, and a are arbitrary integers of 1 or more, β, Γ, x, and y are arbitrary integers of 0 or more, and β and Γ are not 0 at a same time,
   wherein the annealing is performed in a non-oxidizing atmosphere.

2. The method of claim 1, wherein the oxygen-containing silicon compound gas is an alkoxysilane-based compound gas.

3. The method of claim 2, wherein the alkoxysilane-based compound gas is at least one selected from tetramethoxysilane, methyltrimethoxysilane, tetraethoxysilane, dimethyldimethoxysilane, triethoxysilane, trimethoxysilane, and trimethoxy disiloxane.

4. The method of claim 3, wherein, as the film-forming gas, a first additive gas, which is a compound having a $Si-C_m H_n$ bond, is added.

5. The method of claim 4, wherein, as the film-forming gas, a second additive gas, which is a silicon compound having a structural formula represented by $Si_s N_t C_u H_v$ (where s and v are arbitrary integers of 1 or more, and t and u are arbitrary integers of 0 or more) is added.

6. The method of claim 5, wherein the non-oxidizing hydrogen-containing gas is at least one selected from a $H_2$ gas, a $NH_3$ gas, and a $SiH_4$ gas.

7. The method of claim 6, wherein the forming the film of the flowable silanol compound is performed at a substrate temperature of 250 degrees C. or lower.

8. The method of claim 7, wherein the forming the film of the flowable silanol compound is performed at a substrate temperature of −10 to 100 degrees C.

9. The method of claim 1, wherein the annealing is performed at a temperature higher than a temperature when forming the film, which is in a range of 80 degrees C. to 850 degrees C.

10. The method of claim 1, wherein, as the film-forming gas, a first additive gas, which is a compound having a $Si-C_m H_n$ bond, is added.

11. The method of claim 1, wherein, as the film-forming gas, a second additive gas, which is a silicon compound having a structural formula represented by $Si_s N_t C_u H_v$ (where s and v are arbitrary integers of 1 or more, and t and u are arbitrary integers of 0 or more) is added.

* * * * *